(12) United States Patent
Ng et al.

(10) Patent No.: US 6,902,981 B2
(45) Date of Patent: Jun. 7, 2005

(54) STRUCTURE AND PROCESS FOR A CAPACITOR AND OTHER DEVICES

(75) Inventors: Chit Hwei Ng, Singapore (SG); Chaw Sing Ho, Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 313 days.

(21) Appl. No.: 10/268,315

(22) Filed: Oct. 10, 2002

(65) Prior Publication Data

US 2004/0072406 A1 Apr. 15, 2004

(51) Int. Cl.[7] .......................... H01L 21/20; H01L 29/00
(52) U.S. Cl. ...................... 438/381; 438/399; 257/532; 257/535
(58) Field of Search ................................. 257/499, 528, 257/532, 535; 438/329, 381, 393, 396, 399

(56) References Cited

U.S. PATENT DOCUMENTS

| | | | |
|---|---|---|---|
| 6,008,083 A | 12/1999 | Brabazon et al. | 438/239 |
| 6,040,596 A | 3/2000 | Choi et al. | 256/306 |
| 6,057,572 A * | 5/2000 | Ito et al. | 257/296 |
| 6,075,266 A * | 6/2000 | Yoshitomi | 257/306 |
| 6,387,770 B2 | 5/2002 | Roy | 438/384 |
| 6,387,775 B1 | 5/2002 | Jang et al. | 438/396 |
| 6,410,386 B1 | 6/2002 | Hsue et al. | 438/253 |
| 6,617,666 B2 * | 9/2003 | Yoshitomi et al. | 257/535 |

OTHER PUBLICATIONS

Zurcher, et al. , Integration of thin film MIM capacitors and resistors into Copper Metallization based RF–CMSO and Bi–cmos Technologies, IEDM 00–0153 to 156, 2000.

* cited by examiner

*Primary Examiner*—Michael S. Lebentritt
*Assistant Examiner*—Scott B. Geyer

(57) ABSTRACT

A structure and method of fabrication of a capacitor and other devices by providing a semiconductor structure and providing a top insulating layer and conductive features over the semiconductor structure; forming a first conductive layer over the top insulating layer; patterning the first conductive layer to form at least a capacitor bottom plate and a first portion of the first conductive layer; forming a capacitor dielectric layer over the top insulating layer and the capacitor bottom plate and the first portion of the first conductive layer; forming a second conductive layer over the capacitor dielectric layer; and patterning the second conductive layer to form at least a top plate over the bottom plate and a first section of the second conductive layer on the capacitor dielectric layer. The embodiment can further comprise conductive features in the top insulating layer that can underlie the bottom plate, the first portion or/and the first section. The first portion and the first section can form resistors, capacitors or other devices.

43 Claims, 5 Drawing Sheets

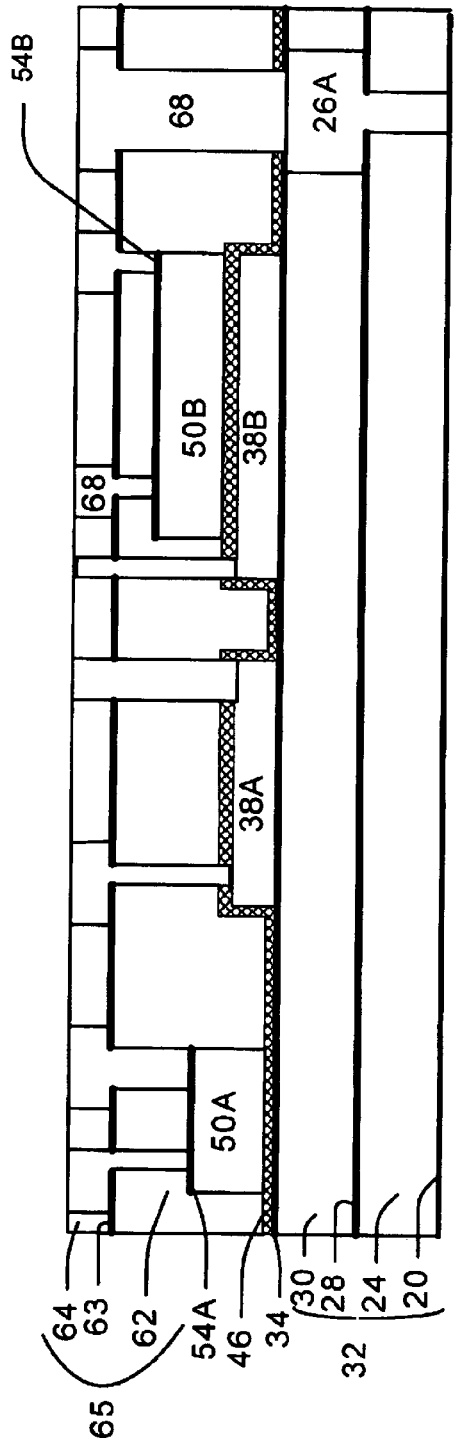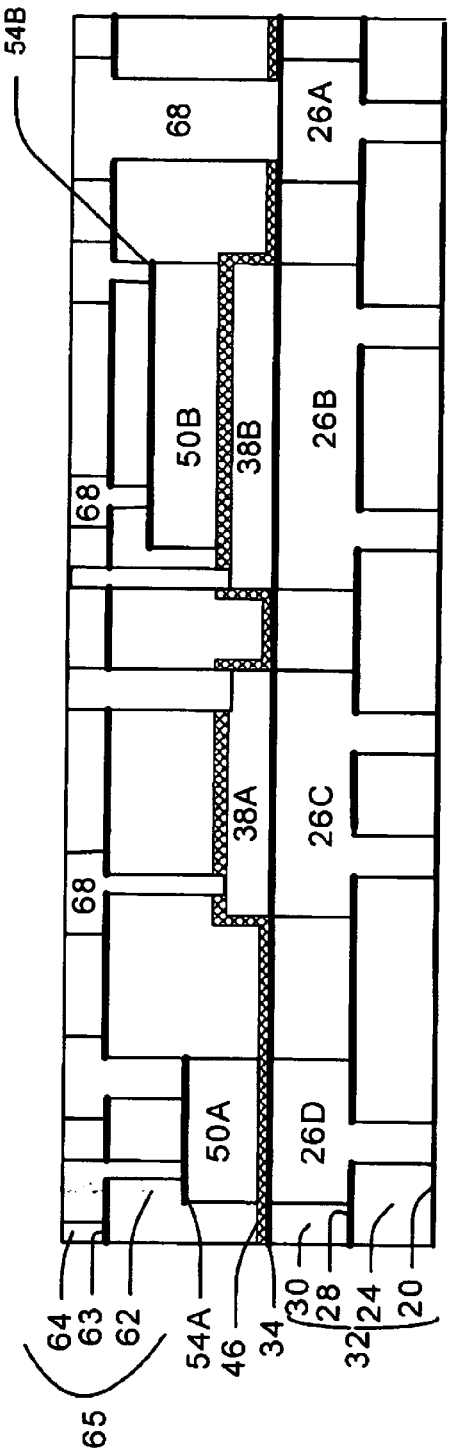

STRUCTURE AND PROCESS FOR A CAPACITOR AND OTHER DEVICES

BACKGROUND OF THE INVENTION

1) Field of the Invention

This invention relates generally to fabrication of semiconductor devices and more particularly to the fabrication of a capacitor and also to the simultaneous fabrication of capacitors and other devices, such as resistors and also to the simultaneous fabrication of MIM (Metal—Insulator—Metal) capacitors and other devices, such as resistors and capacitors.

2) Description of the Prior Art

It is well known that capacitors are critical components in today's integrated circuits. For example, capacitors play an important role in devices having analog circuits constructed on the integrated circuit chips, often being placed adjacent the device circuitry to carry out de-coupling functions. However, achieving the desired capacitance characteristics is often difficult due to several trends in the industry, namely increasing device density and increasing frequency of operating signals. First, since increased device densities has been achieved largely by the miniaturization of individual devices, it requires a similar miniaturization in capacitor structure, thereby placing a much greater importance on a high capacitance value per unit area. Second, higher operating frequencies have also increased the level of parasitic capacitance and cross-talk experienced between adjacent signal lines or metallization levels thereby increasing the demand upon many capacitors. However, fabrication of capacitance devices within or immediately adjacent the integrated circuit is often limited by design patterning rules. This is particularly true for capacitors intended for use in analog circuitry placed in immediate proximity to the metallization levels.

In addition, current designs can include capacitors and resistors, particularly in RF applications. There is a challenge to develop a manufacturable and cost effect process that can make various capacitors and resistors.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,387,770b2(Roy) that reveals a process for forming a MIM Capacitor in a damascene process.

U.S. Pat. No. 6,387,775b1(Jang et al.) shows a method for a MIM Capacitor in a Cu damascene process.

U.S. Pat. No. 6,008,083(Brabazon et al.) teaches a method for a MIM capacitor using two metal layers.

U.S. Pat. No. 6,410,386b12(Hsue et al.) shows a method of a metal capacitor in a damascene process.

U.S. Pat. No. 6,040,596(Choi et al.) discloses a process for a capacitor and a resistor made of the same material as the plate electrode.

SUMMARY OF THE INVENTION

It is an object of the present invention to provide a structure and method for fabricating a capacitor.

It is an object of an embodiment of the present invention to provide a method for fabricating a capacitor and a resistor or other device using the same conductive layers.

It is an object of an embodiment of the present invention to provide a structure for semiconductor device with a capacitor and a resistor or other device comprised of the same conductive layers.

An embodiment of the present invention provides a method of manufacturing a capacitor and another device, such as a resistor, which is characterized as follows. An embodiment of the invention relates to a method of fabrication of a capacitor in a semiconductor device; comprises the following:

a) providing a semiconductor structure and providing a top insulating layer and conductive features over the semiconductor structure;

b) forming a first conductive layer over the top insulating layer;

c) patterning the first conductive layer to form at least a capacitor bottom plate and a first portion of the first conductive layer;

d) forming a capacitor dielectric layer over the top insulating layer and the capacitor bottom plate and the first portion of the first conductive layer;

e) forming a second conductive layer over the capacitor dielectric layer; and f) patterning the second conductive layer to form at least a top plate over the bottom plate and a first section of the second conductive layer on the capacitor dielectric layer.

A further embodiment can comprise conductive features in the top insulating layer that can underlie the bottom plate, the first portion or/and the first section.

A further embodiment can comprise the first portion and the second portion form devices such as resistors, capacitor or anti-fuses.

Another embodiment of a semiconductor device having a capacitor; comprises:

a) a semiconductor structure;

b) a top insulating layer and conductive features in the top insulating layer over the semiconductor structure;

c) a capacitor bottom plate and a first portion over the top insulating layer; the capacitor bottom plate and the first portion comprised of material from a first conductive layer;

d) a capacitor dielectric layer over the top insulating layer, the capacitor bottom plate and the first portion of the first conductive layer;

e) a top plate over the bottom plate and a first section of a second conductive layer on the capacitor dielectric layer; the top plate and the first section are comprised of the second conductive layer.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1, 2, 3, 4, 5, 6, 7A and 7B are cross sectional views for illustrating a method for manufacturing a capacitor according to a preferred embodiment of the present invention.

DETAILED DESCRIPTION OF THE PREFERRED EMBODIMENTS

The present invention will be described in detail with reference to the accompanying drawings. The present invention provides a method of forming a capacitor and other devices such as, additional capacitors and resistors. A preferred embodiment of the invention is described below.

Figure 1:
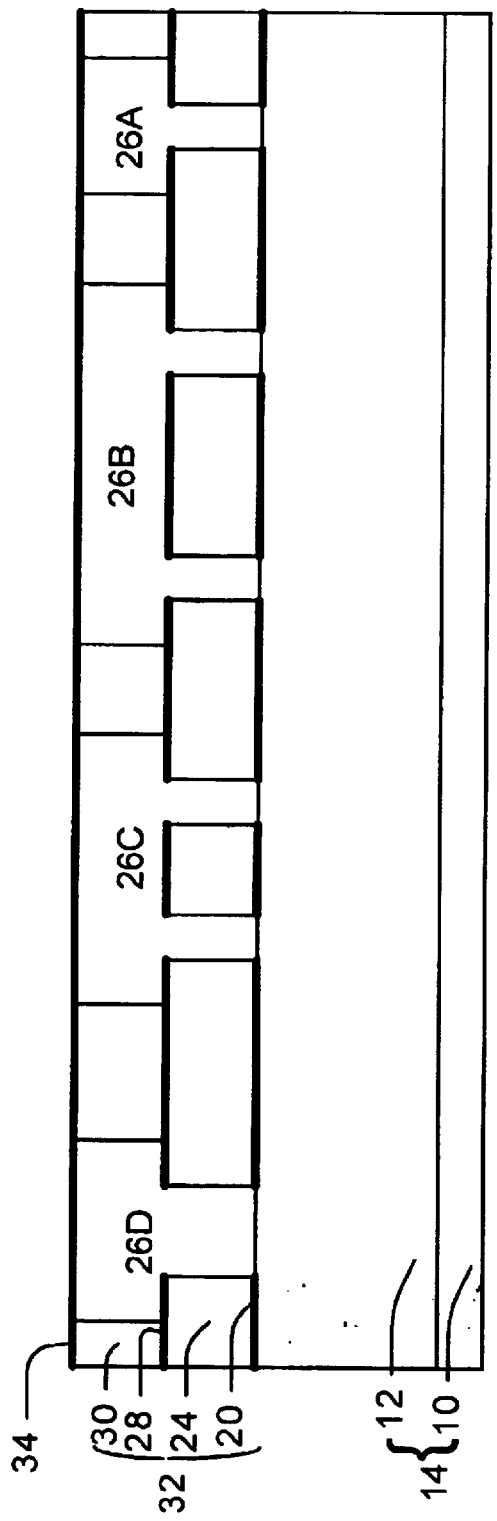

Referring to FIG. 1, we provide a semiconductor structure 14 having a top insulating layer 32 (e.g., 20 24 28 30 34) and conductive features 26A, 26B, 26C and 26D. The conductive features are optional. For convenience, the conductive features are not shown in FIGS. 2 thru 6A and 7A. The conductive features 26B, 26C and 26D are shown in FIG. 7B to show that none, or any combination of, or all the conductive features 26A, 26B, 26C and 26D can be formed. Preferably at least a portion of the conductive features 26A are exposed thru the top insulating layer 32.

Semiconductor structure 14 is understood to possibly include a wafer or substrate, active and passive devices formed within and/or on the wafer; and insulating and conductive layers formed on the wafer surface. For example, layer 10 could represent a substrate or wafer and layer 12 could represent a dielectric layer such as an inter-level dielectric (ILD) or inter metal dielectric (IMD) layer.

Furthermore, the semiconductor structure can include conductive elements (not shown) such as metal or polysilicon lines.

A top insulating layer 32 is formed over the semiconductor structure 14. The top insulating layer can be comprised of one or more layers.

Preferably as shown in FIG. 1, the top insulating layer 32 is preferably comprised of a bottom etch stop layer 20, a lower dielectric layer 24, a middle etch stop layer 28, and an upper dielectric layer 30. The lower dielectric layer 24 and upper dielectric layer 30 (e.g., inter metal dielectric (IMD) layers) are preferably comprised of low K dielectric materials (i.e., K less than 4.0) or oxide.

The bottom and middle etch stop layers 20 28 are preferably comprised of silicon nitride (SiN) or SiC. The etch stop layers have a different etch selectivity than the dielectric layers 24 30.

Figure 8:
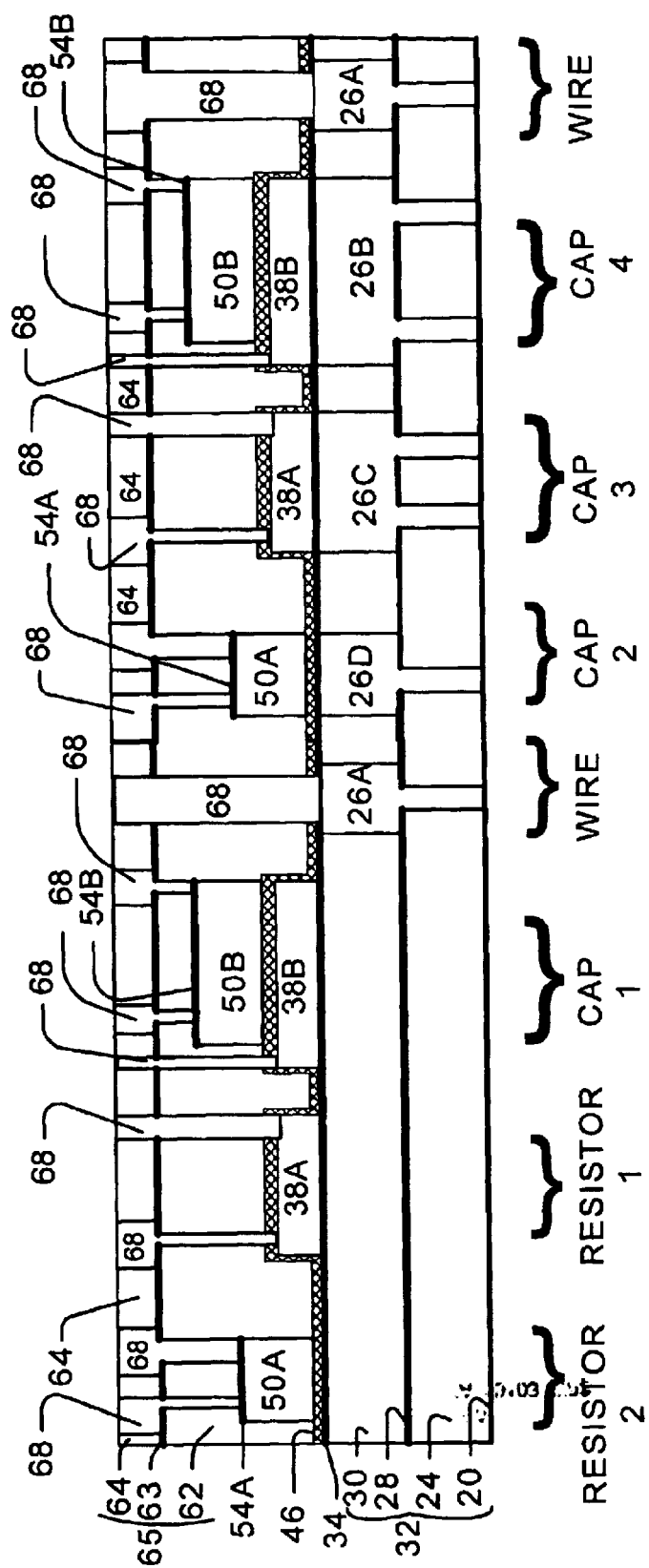
FIG. 8 is a cross sectional view for illustrating preferred embodiments according to the present invention where resistors and capacitors are formed in any combination shown in the figure.

Referring to FIG. 1, conductive features (e.g., 26A, 26B, 26C and 26D) can be formed over the semiconductor structure. The conductive features can be interconnects such as dual damascene type interconnects. Features 26B, 26C and 26D are optional elements and may or may not be formed depending on the design. Features 26B, 26C and 26D are in FIG. 1 and FIG. 7B. The features are optional and show their possible placement under other conductive elements above. Features 26B, 26C and 26D can allow capacitive devices to be formed there over as shown in FIGS. 7B and 8 and described below. Features are not illustrated in FIGS. 2 to 7A, but it is understood that they may be included.

As shown in FIG. 1, a top etch stop layer 34 is formed over the top insulating layer. The top etch stop layer 34 is preferably comprised of a dielectric layer and more preferably comprised of silicon nitride (SiN) or SiC.

Figure 2:
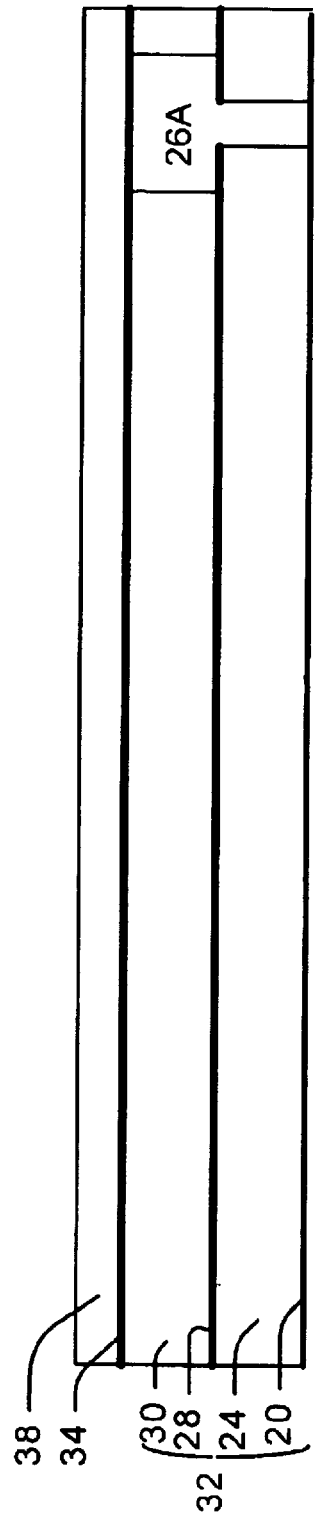
Figure 3:
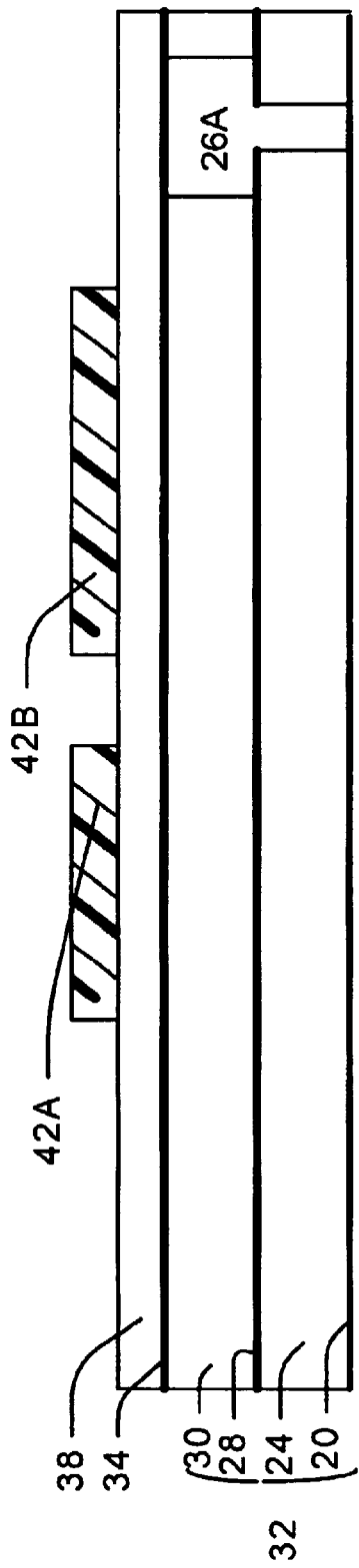
Figure 4:
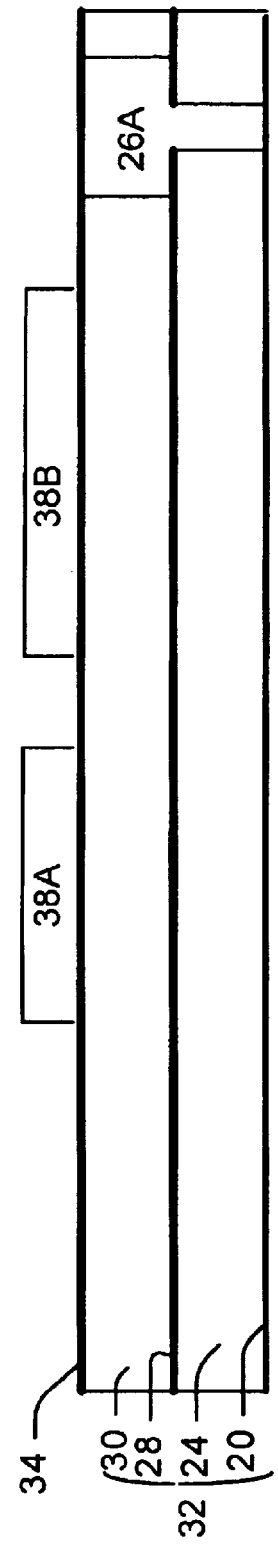

Next, a patterned first conductive layer having at least 2 portions (38A 38B) is formed over the top insulating layer 32. A preferred process is shown in FIGS. 2, 3 and 4. Referring to FIG. 2, we form a first conductive layer 38 over the top insulating layer 20. The first conductive layer 38 is preferably comprised of Ta, TaN, TiN, Ti, AlCu, AlCu metal stack, an AlCu metal stack of TiN/AlCu/Ti, an AlCu metal stack of Ti/TiN/AlCu/Ti, metal or metal alloys and more preferably comprised of Ta. The first conductive layer 38 can comprise a lower barrier layer, a center metal layer and an upper barrier layer such as TiN/AlCu/Ti or Ti/TiN/AlCu/Ti. The material and thickness of the first conductive layer can be selected according to the resistance, capacitance and other properties needed.

As shown in FIGS. 3 and 4, preferably we pattern the first conductive layer 38 to form at least a capacitor bottom plate 38B and a first portion 38A of the first conductive layer (e.g., resistor or top plate or bottom plate). The patterning of the first conductive layer 38 preferably comprises (See FIG. 3) forming a mask pattern 42A 42B (e.g., resist) over the first conductive layer 38. As shown in FIG. 4, we preferably etch the first conductive layer 38 preferably using a top etch stop layer 34 as an etch stop. Preferably, the etch has an over etch that removes substantially all of the unmasked conductive layer and removes some portion but not all of the etch stop layer 34. Preferably between 100 and 150 Å of the top etch stop layer 34 remain after the etch. Preferably the etch does not expose any underlying conductive features. It is important not to expose any underlying conductive features (e.g., 26A, Cu lines) that may cause particle generation. The mask patterns 38A 38B are removed.

Figure 5:
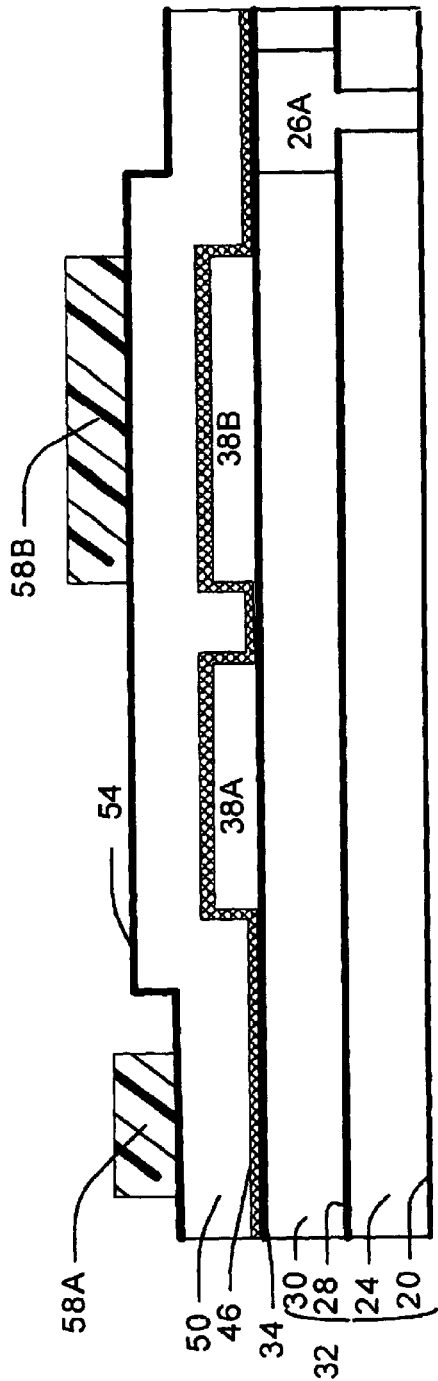

Referring to FIG. 5, we form a capacitor dielectric layer 46 over at least the top insulating layer 12, the capacitor bottom plate 38B and the first portion 38A of the first conductive layer. The capacitor dielectric layer is preferably comprised of silicon nitride and preferably has a thickness between 500 and 650 Å. The capacitor dielectric layer can be formed of other dielectric materials. The capacitor dielectric layer 46 can act as an etch stop in subsequent steps. The thicknesses of the capacitor dielectric layer 46 and the etch stop layer 34 can be set to obtain a desired capacitance of capacitors and other device subsequently formed. The thicknesses of the capacitor dielectric layer 46 and the etch stop layer 34 can vary from about 100 Å to 3000 Å depending on the application.

Figure 6:
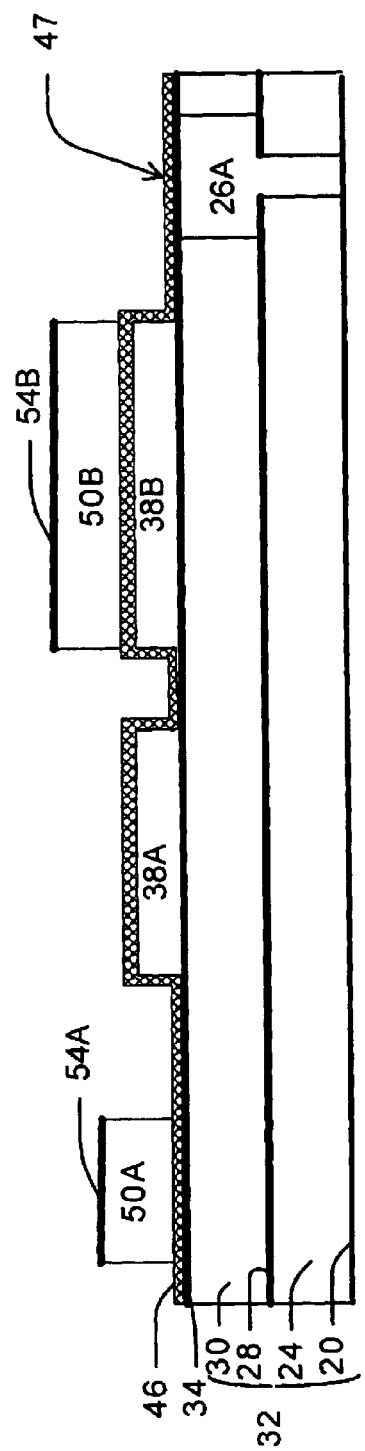

Next, sections (e.g., 54A 54B) of a second conductive layer are formed over the capacitor dielectric layer as shown in FIG. 6. The preferred process is shown in FIGS. 5 and 6.

Referring to FIG. 5, we preferably form a second conductive layer 50 over the capacitor dielectric layer 46. The second conductive layer 46 is preferably comprised Ta, TaN, TiN, Ti, AlCu, or other metals and alloys and most preferably comprised of Ta. Depending on the design objectives, the second conductive layer can be formed of different materials, thicknesses and/or electrical properties than that of the first conductive layer. It is an advantage of the invention to form resistor, capacitors with combinations of both the first and second conductive layer or/and underlying conductive features.

As shown in FIG. 5, we form a cap etch stop layer 54 on the second conductive layer 50. The cap etch stop layer is preferably comprised of silicon nitride or SiC and preferably has a thickness between 400 and 600 Å and more preferably about 500 Å.

Next, we pattern the second conductive layer 50 to form at least a top plate 50B over the bottom plate 38B and a first section 50A of the second conductive layer on the capacitor dielectric layer 46 over the top insulating layer 32. FIGS. 5 and 6 show a preferred process to pattern the second conductive layer 50.

As shown in FIG. 5, a mask pattern having at least segments 58A and 58B is formed over the cap etch stop layer 54 and second conductive layer 50.

As shown in FIG. 6, the cap etch stop layer 54 and second conductive layer 50 are etched using the mask pattern segments 54A and 54B as etch masks to form at least a top plate 50B over the bottom plate 38B and a first section 50A of the second conductive layer. The first section 50A can form a device such as a resistor, bottom plate, anti-fuse, etc.

The etch is preferably stopped by the capacitor dielectric layer 46. Preferably the capacitor dielectric layer remains and cover the underlying conductive features 26A and bottom plate 38B and portion 38A. For, example in section 47 over the conductive feature 26A, a total thickness of the capacitor dielectric layer 46 and the etch stop layer 34 between 500 and 650 Å remain over the conductive feature 26A.

A MIM (metal-insulator-metal) capacitor is comprised of top plate 50B, capacitor dielectric 46 and the bottom plate 38B.

Next, dielectric layer and interconnection are formed to connect to the devices (e.g., capacitors, lines and resistors). A preferred process is shown in FIGS. 7A and 7B. The processes and structure formed in FIGS. 7A and 7B can be form simultaneously the same substrate. FIG. 7B shows optional conductive features 26A 26b 26c and 26D under the capacitors and devices. We form an insulating layer 65 (e.g., layers 62 63 64) over the top insulating layer 32. The insulating layer 65 is preferably comprised of a lower IMD layer 62, a middle etch stop 63 and a upper IMD layer 64. The IMD layers 62 and 64 are preferably comprised of low k materials or oxides. The middle etch stop 63 can be formed as described above for the top etch stop layer 34.

Next, openings are etched in the insulating layer 65 (or layers 62 63 64) preferably using a photo process and more preferably using a dual damascene photo process. The etch stop layers 54A 54B, capacitor dielectric layer 46 and top etch stop layers 46 serve as buffer layer for the etches. Theses layers will stop the etch from etching the capacitor plates 38B 50B and resistors 50A 38A even though there is a difference in the thickness of the dielectric layer between the areas where the capacitors/resistors and the conductive features (e.g., interconnect 26A) reside.

A multi-step etch is preferably used to form the openings for the interconnects 68. A first etch step uses a chemistry that selectively removes the dielectric layers. When the etch reaches the etch step layers (e.g., SiN or SiC) over the capacitor and resistors the etch will stop on the etch stop layers and continue etching the dielectric layers over the interconnects (e.g., 26A). When the etch reaches the etch stop layer(s) 46 34 over the interconnect (e.g., 26a), a second etch step uses a different etch chemistry that etches the etch stop layers selectively. This forms openings in the various etch stop and dielectric layers to the various capacitors and resistors and interconnects.

As shown in FIGS. 7A and 7B, we form interconnections 68 to contact the first portion of the first conductive layer (e.g., first resistor) 38A, the bottom plate 38B, the top plate 50B and the first section 50A of the second conductive layer; the conductive features (e.g., 26A). FIG. 7B shows an option were conductive features (26B 26C 26D) are formed under the capacitors and conductive sections/portions. Refer to FIG. 1. The conductive features are preferably interconnection and more preferably Cu dual damascene interconnections.

As shown in FIG. 7B, the conductive features can further comprise a lower bottom plate 26B under the bottom plate 38B and under the top etch stop layer 34.

As shown in FIG. 7B, the conductive features can further comprise a first interconnect 26C under the first portion 38A of first conductive layer. A single mask capacitor 26C 34 38A is formed when the first interconnect 26C acts as a capacitor bottom plate, the layer 34 act as a capacitor dielectric layer, and the first portion 38A acts as a top plate.

As shown FIG. 7B, the conductive features can further comprise a conductive structure 26D under the capacitor dielectric layer 46 and the first section 50A of the second conductive layer. A capacitor can be formed when the interconnect 26D acts as the bottom plate, the layers 34 and 46 act as a capacitor dielectric layer and the first section 50A acts a top plate.

FIGS. 7A and 7B show various combination of devices (e.g., resistor and capacitors and interconnects). All or any combination(s) of devices shown in FIGS. 7A and 7B can be formed using the embodiments.

FIG. 8 also shows many possible combinations of devices that can be formed using the embodiment's process. FIG. 8 shows the following devices:

resistor 50A (resistor 1)—formed with the second conductive layer.

resistor 38A (resistor 2)—Formed with the first conductive layer dual mask capacitor 38B, 46 50B (capacitor 1) (formed by two photo masks)

Capacitor 26D, 34/46, 50A (capacitor 2)—also may be an anti-fuse

Capacitor 26C, 34, 38A—(capacitor 3) (single mask capacitor)—also may be an anti-fuse capacitor—(capacitor 4) combination of single and dual mask capacitors 26B 38B 50B (e.g., interconnect under a dual mask capacitor)—The lower electrode 26B preferably underlies a significant area of the plate 38B preferably between 50 and 100% and more preferably between 80 and 100%.

wire line 26A

A preferred embodiment is where the first portion 38A and the first section 50A are resistors. Another preferred embodiment is where first portion 38A and the first section 50A are resistors that have different resistances.

In other embodiments, the first portion 38A and the first section 50A can act as any other devices, such as inductors, anti-fuses or fuses if the portions/sections have the proper electrical properties suitable for the devices. The bottom plates of capacitors 2, 3 and 4 (26D 26B and 26A) can be wired in different ways and not limited by the configuration in the FIGS. For example the bottom plates of capacitors 2, 3 and 4 (26D 26B and 26A) can be wired up to interconnects 68.

The preferred embodiments of the invention have many advantages over prior art processes. The embodiments uses only two additional masking steps in the BEOL process to form resistors with two different resistances. In addition, at least four different configurations of capacitors can be form simultaneously with the resistors.

In the embodiments, with only 2 additional masks, 4 different types of capacitors and 2 different devices (e.g., resistors) can be formed.

The embodiments also allow flexibility of the metal materials and metal thicknesses of the resistors 1 and 2 which are formed simultaneously with the capacitors.

Also, capacitors 2 and 3 (see FIG. 8) can act as anti-fuse. The anti-fuses may be placed between the vias.

Preferred embodiments of a structure of the invention is shown in FIGS. 7A, 7B and FIG. 8. A description is below. FIGS. 7A, 7B and 8 illustrate that any combination of devices shown in the figs can be fabricated.

A semiconductor structure 14 and an overlie a top insulating layer 32 (e.g., 20 24 28 30 34) and conductive features 26A in the top insulating layer. Preferably at least a portion of one of the conductive features 26A exposed.

A top etch stop layer 34 is over the top insulating layer and the conductive features 26A.

A capacitor bottom plate 38B and a first portion 38A of the first conductive layer are comprised of a first conductive layer 38.

A capacitor dielectric layer 46 is over the top insulating layer 12 and the capacitor bottom plate 38B and a first portion 38A of the first conductive layer. The first portion 38A of the first conductive layer preferably acts as a resistor or other device.

A top plate 50B is over the bottom plate 38B and a first section 50A of the second conductive layer on the capacitor dielectric layer 46 over the top insulating layer 32. The top plate 50B and the first section 50A are preferably comprised of a second conductive layer 50 and an overlying cap etch stop layer 54.

An insulating layer 65 (e.g., 62 63 64) is over the top insulating layer 32.

Interconnections preferably contact to at least: the first portion of the first conductive layer, the bottom plate 38B, the top plate 50B and the first section 50A of the second conductive layer; and the conductive features.

The first section 50A of the second conductive layer preferably acts as a resistor.

As shown in FIGS. 7B and 8, the conductive features further can comprise a lower bottom plate 26B under the bottom plate 38B and under the top etch stop layer 34.

As shown in FIGS. 7B and 8, the conductive features preferably further comprise a first interconnect 26C under the first portion 38A of first conductive layer. The first interconnect 26C preferably acts as a bottom plate and the first portion 38A acts as a top plate in a capacitor.

As shown in FIGS. 7B and 8, the conductive features preferably further comprise a conductive structure 26D under the capacitor dielectric layer 46 and the first section 50A of the second conductive layer. Preferably, the conductive structure 26D acts at a bottom plate and the first section 50A acts as a top plate in a capacitor.

In the above description numerous specific details are set forth such as, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Unless explicitly stated otherwise, each numerical value and range in the specification and claims should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a capacitor in a semiconductor device; comprising the steps of:
   providing a semiconductor structure and providing a top insulating layer and conductive features over said semiconductor structure;
   forming at least a capacitor bottom plate and a first portion comprised of a first conductive layer;
   forming a capacitor dielectric layer over said top insulating layer, said capacitor bottom plate and said first portion of said first conductive layer;
   forming a second conductive layer over said capacitor dielectric layer; and
   patterning said second conductive layer to form at least a top plate over said bottom plate and to form a first section of said second conductive layer on said capacitor dielectric layer.

2. The method of claim 1 which further includes:
   forming an insulating layer over said top insulating layer;
   forming interconnections to contact at least: said first portion of said first conductive layer, said bottom plate, said top plate and said first section of said second conductive layer.

3. The method of claim 1 wherein a top etch stop layer is formed on said top insulating layer and said conductive features; and said top etch stop layer is comprised of SiN or SiC and has a thickness between 400 to 600 Å.

4. The method of claim 1 wherein said top insulating layer is comprised of a
   bottom etch stop layer, a lower dielectric layer, a middle etch stop layer, a upper dielectric layer;
   said bottom etch stop layer and said middle etch stop layer are comprised of silicon nitride or SiC; and
   said lower dielectric layer and said upper dielectric layer are comprised of a low k material or an oxide.

5. The method of claim 1 wherein said first conductive layer is comprised of a material selected from the group consisting of Ta, TaN, TiN, Ti, and AlCu alloys.

6. The method of claim 1 which further includes:
   forming a first conductive layer over said top insulating layer;
   patterning said first conductive layer to form at least a capacitor bottom plate and a first portion comprised of said first conductive layer;
wherein the patterning of said first conductive layer comprises forming a mask pattern over said first conductive layer; and etching said first conductive layer.

7. The method of claim 1 wherein said first portion of said first conductive layer acts as a resistor.

8. The method of claim 1 wherein said first section of said second conductive layer acts as a resistor.

9. The method of claim 1 wherein said first section of said second conductive layer has a different resistivity than said first portion of said first conductive layer; and
   said first section and said first portion are resistors.

10. The method of claim 1 wherein said first section of said second conductive layer is a resistor, fuse, anti-fuses or inductor and said first portion of said first conductive layer is a resistor, fuse, anti-fuse or inductor.

11. The method of claim 1 wherein said conductive features further comprise a lower bottom plate under said bottom plate and under said top etch stop layer.

12. The method of claim 1 wherein said conductive features further comprise a first interconnect under said first portion of first conductive layer; said first interconnect acts as a bottom plate and said first portion acts as a top plate in a capacitor.

13. The method of claim 1 wherein said conductive features further comprise a conductive structure under said capacitor dielectric layer and said first section of said second conductive layer; said conductive structure acts at a bottom plate and said first section acts as a top plate in a capacitor.

14. A method of fabrication of a capacitor in a semiconductor device; comprising the steps of:
 a) providing a semiconductor structure and providing a top insulating layer and conductive features in said top insulating layer;
 b) forming a top etch stop layer over said top insulating layer and said conductive features;
 c) forming a first conductive layer over said top insulating layer;
 d) patterning said first conductive layer to form at least a capacitor bottom plate and a first portion of said first conductive layer;
 e) forming a capacitor dielectric layer over said top insulating layer and said capacitor bottom plate and a first portion of said first conductive layer;
  (1) said first portion of said first conductive layer acts as a resistor;
 f) forming a second conductive layer over said capacitor dielectric layer;
 g) forming a cap etch stop layer on said second conductive layer;
 h) patterning said second conductive layer and cap etch stop layer to form at least a top plate over said bottom plate and to form a first section of said second conductive layer on said capacitor dielectric layer over said top insulating layer;
 i) forming an insulating layer over said top insulating layer;
 j) forming interconnections to contact at least: said first portion of said first conductive layer, said bottom plate, said top plate and said first section of said second conductive layer; and said conductive features.

15. The method of claim 14 wherein said top insulating layer is comprised of a bottom etch stop layer, a lower dielectric layer, a middle etch stop layer, a upper dielectric layer; said bottom etch stop layer, and said middle etch stop layer are comprised of silicon nitride or SiC; said lower dielectric layer and said upper dielectric layer are comprised of a low k material or an oxide.

16. The method of claim 14 said first conductive layer is comprised of a material selected from the group consisting of: Ta, TaN, TiN, Ti, and AlCu alloys.

17. The method of claim 14 wherein the patterning of said first conductive layer comprises forming a mask pattern over said first conductive layer; and etching said first conductive layer using a top etch stop layer as a etch stop; and not exposing said conductive features.

18. The method of claim 14 wherein said capacitor dielectric layer is comprised of silicon nitride and has thickness between 500 and 650 Å.

19. The method of claim 14 wherein said first section of said second a conductive layer acts as a resistor.

20. The method of claim 14 wherein said first section of said second conductive layer has a different resistivity than said first portion of said first conductive layer and said first section and said first portion are resistors.

21. The method of claim 14 wherein said conductive features further comprise a lower bottom plate under bottom plate and under said top etch stop layer.

22. The method of claim 14 wherein said conductive features further comprise a first interconnect under said first portion of first conductive layer; said first interconnect acts as a bottom plate and said first portion acts as a top plate in a capacitor.

23. The method of claim 14 wherein said conductive features further comprise a conductive structure under said capacitor dielectric layer and said first section of said second conductive layer; said conductive structure acts at a bottom plate and said first section acts as a top plate in a capacitor.

24. A semiconductor device having a capacitor; comprising:
 a) a semiconductor structure;
 b) a top insulating layer and conductive features in said top insulating layer over said semiconductor structure;
 c) a capacitor bottom plate and a first portion over said top insulating layer; said capacitor bottom plate and said first portion are comprised a first conductive layer;
 d) a capacitor dielectric layer over said top insulating layer, said capacitor bottom plate and said first portion of said first conductive layer;
 e) a top plate over said bottom plate and a first section of a second conductive layer on said capacitor dielectric layer; said top plate and said first section are comprised said second conductive layer.

25. The semiconductor device of claim 24 which further includes:
 an insulating layer over said top insulating layer;
 interconnections contacting to at least: said first portion of said first conductive layer, said bottom plate, said top plate, said first section of said second conductive layer; and said conductive features.

26. The semiconductor device of claim 24 wherein a top etch stop layer is on said top insulating layer and said conductive features; and
 said top etch stop layer is under said capacitor bottom plate and a first portion and said capacitor dielectric layer;
 said top etch stop layer is comprised of SiN or SiC and has a thickness between 400 to 600 Å.

27. The semiconductor device of claim 24 wherein said first portion of said first conductive layer acts as a resistor.

28. The semiconductor device of claim 24 wherein said first section of said second conductive layer acts as a resistor.

29. The semiconductor device of claim 24 wherein said first section of said second conductive layer has a different resistivity than said first portion of said first conductive layer and said first section and said first portion are resistors.

30. The semiconductor device of claim 24 wherein said first section of said second conductive layer is a resistor, fuse, anti-fuse or inductor; and
 said first portion of said first conductive layer is a resistor, fuse, anti-fuse or inductor.

31. The semiconductor device of claim 24 wherein said conductive features further comprise a lower bottom plate under said bottom plate and under a top etch stop layer;
 said top etch stop layer between said lower bottom plate and said bottom plate.

32. The semiconductor device of claim 24 wherein said conductive features further comprise a first interconnect under said first portion of first conductive layer;

said first interconnect acts as a bottom plate and said first portion acts as a top plate in a capacitor.

33. The semiconductor device of claim 24 wherein said conductive features further comprise a conductive structure under said capacitor dielectric layer and said first section of said second conductive layer;

said conductive structure acts at a bottom plate and said first section acts as a top plate in a capacitor.

34. A semiconductor device having a capacitor; comprising:
   a) a semiconductor structure and an overlying top insulating layer and conductive features in said top insulating layer;
   b) a top etch stop layer over said top insulating layer and said conductive features;
   c) a capacitor bottom plate and a first portion of said first conductive layer comprised of a first conductive layer;
   d) a capacitor dielectric layer over said top insulating layer, said capacitor bottom plate and said first portion of said first conductive layer;
      (1) said first portion of said first conductive layer acts as a resistor;
   e) a top plate over said bottom plate and a first section of said second conductive layer on said capacitor dielectric layer over said top insulating layer; said top plate and said first section comprised of a second conductive layer and a overlying cap etch stop layer;
   f) an insulating layer over said top insulating layer;
   g) interconnections to contact at least: said first portion of said first conductive layer, said bottom plate, said top plate and said first section of said second conductive layer, and said conductive features.

35. The semiconductor device of claim 34 wherein said top etch stop layer is comprised of SiN or SiC and has a thickness between 400 and 600 Å.

36. The semiconductor device of claim 34 wherein said first conductive layer is comprised of a material selected from the group consisting of Ta, TaN, TiN, Ti, and AlCu alloy.

37. The semiconductor device of claim 34 wherein said capacitor dielectric layer is comprised of silicon nitride and has a thickness between 500 and 650 Å.

38. The semiconductor device of claim 34 wherein said first section of said second conductive layer acts as a resistor.

39. The semiconductor device of claim 34 wherein said first section of said second conductive layer has a different resistivity than said first portion of said first conductive layer and said first section and said first portion are resistors.

40. The semiconductor device of claim 34 wherein said first section of said second conductive layer is a resistor, fuse, anti-fuses or inductor and said first portion of said first conductive layer is a resistor, fuse, anti-fuse or inductor.

41. The semiconductor device of claim 34 wherein said conductive features further comprise a first interconnect under said first portion of first conductive layer; said first interconnect acts as a bottom plate and said first portion acts as a top plate in a capacitor.

42. The semiconductor device of claim 34 wherein said conductive features further comprise a conductive structure under said capacitor dielectric layer and said first section of said second conductive layer; said conductive structure acts at a bottom plate and said first section acts as a top plate in a capacitor.

43. The semiconductor device of claim 34 wherein said conductive features further comprise a lower bottom plate under said bottom plate and under said top etch stop layer.

* * * * *